(12) United States Patent
Maeta et al.

(10) Patent No.: US 7,994,532 B2
(45) Date of Patent: Aug. 9, 2011

(54) LED INDICATOR CASING, LED INDICATOR, AND LED INDICATOR JOINT MEMBER COMPRISING HANGER MEMBERS

(75) Inventors: Susumu Maeta, Tottori (JP); Mitsuhiro Omae, Tottori (JP); Akihisa Matsumoto, Tottori (JP); Takafumi Watanabe, Tottori (JP)

(73) Assignee: Sanyo Electric Co., Ltd., Osaka (JP)

( * ) Notice: Subject to any disclaimer, the term of this patent is extended or adjusted under 35 U.S.C. 154(b) by 831 days.

(21) Appl. No.: 11/631,343

(22) PCT Filed: Jun. 29, 2005

(86) PCT No.: PCT/JP2005/011899
§ 371 (c)(1),
(2), (4) Date: Dec. 29, 2006

(87) PCT Pub. No.: WO2006/003908
PCT Pub. Date: Jan. 12, 2006

(65) Prior Publication Data
US 2007/0183159 A1    Aug. 9, 2007

(30) Foreign Application Priority Data

Jun. 30, 2004    (JP) .................................. 2004-192412

(51) Int. Cl.
*H01L 33/00*    (2010.01)
(52) U.S. Cl. ...... 257/99; 257/81; 257/100; 257/E33.056; 257/E33.057; 257/E33.058; 362/249.01; 362/249.02; 362/249.03; 362/249.04; 362/362; 206/707; 206/716; 206/725

(58) Field of Classification Search ................... 257/81, 257/99, E33.056, E33.058, E33.057, 100; 362/362, 249.02, 249.01, 249.03, 249.04; 206/707, 725, 716
See application file for complete search history.

(56) References Cited

U.S. PATENT DOCUMENTS

| | | | | |
|---|---|---|---|---|
| 4,959,761 A * | 9/1990 | Critelli et al. | ................. | 362/646 |
| 5,519,596 A * | 5/1996 | Woolverton | ............. | 362/249.01 |
| 6,345,902 B2 * | 2/2002 | Ohkohdo et al. | ............. | 362/549 |
| 6,483,623 B1 * | 11/2002 | Maruyama | .................... | 398/182 |
| 6,995,510 B2 * | 2/2006 | Murakami et al. | ............ | 313/512 |
| 2003/0042844 A1 | 3/2003 | Matsumura et al. | | |
| 2004/0046242 A1 * | 3/2004 | Asakawa | ...................... | 257/678 |

FOREIGN PATENT DOCUMENTS

| | | |
|---|---|---|
| JP | 57-045982 | 3/1982 |
| JP | 63-159859 | 10/1988 |
| JP | 2000-312033 | 11/2000 |
| JP | 2002-223003 | 8/2002 |
| JP | 2002-344030 | 11/2002 |

(Continued)

*Primary Examiner* — Matthew E Warren
*Assistant Examiner* — David Chen
(74) *Attorney, Agent, or Firm* — McDermott Will & Emery LLP (57) ABSTRACT

An LED indicator casing (1R) has: a casing (1a) including a bottom face (S1), a front face (S2) having an aperture (2a) for light emission, and paired side faces (S3 and S4) adjoining the front face (S2); and paired lead terminals (11 and 12), one of which has a light-emitting element (LED)(21) fitted thereto. The paired lead terminals (11 and 12) are led out to the bottom face (S1) via the paired side faces (S3 and S4) of the casing (1a) respectively.

5 Claims, 8 Drawing Sheets

FOREIGN PATENT DOCUMENTS

| | | |
|---|---|---|
| JP | 2003-031748 | 1/2003 |
| JP | 2003-078172 | 3/2003 |
| JP | 2003-168824 | 6/2003 |
| JP | D1175164 | 6/2003 |
| JP | D1175166 | 6/2003 |
| JP | 2003-188422 | 7/2003 |
| JP | 2003-249689 | 9/2003 |
| JP | 2004-134699 | 4/2004 |

* cited by examiner

LED INDICATOR CASING, LED INDICATOR, AND LED INDICATOR JOINT MEMBER COMPRISING HANGER MEMBERS

RELATED APPLICATION

This application is a national phase of PCT/JP2005/011899 filed on Jun. 29, 2005, which claims priority from Japanese Application No. 2004-192412 filed Jun. 30, 2004, the disclosures of which Applications are incorporated by reference herein. The benefit of the filing and priority dates of the International and Japanese Applications is respectfully requested.

TECHNICAL FIELD

The present invention relates to an LED indicator casing, an LED indicator, and an LED indicator joint member. More particularly, the present invention relates to an LED indicator that remains reliable after being mounted on a circuit board, a casing for such an LED indicator, and an LED indicator joint member for holding together a plurality of such LED indicator casings or a plurality of such LED indicators.

BACKGROUND ART

As portable telephones become increasingly multifunctional, they come to contain more and more electronic components and control circuits.

Simultaneously, portable telephones are sought to be increasingly compact and lightweight. Accordingly, in portable telephones, the electronic components and control circuits contained therein are sought to be compact and lightweight. Among others, liquid crystal displays, at the same time that they are given larger and larger display areas and become fitted with a plurality of indicators, are sought to be thin. Accordingly, LED indicators used as backlights in liquid crystal displays are sought to be increasingly thin.

Figure 7:
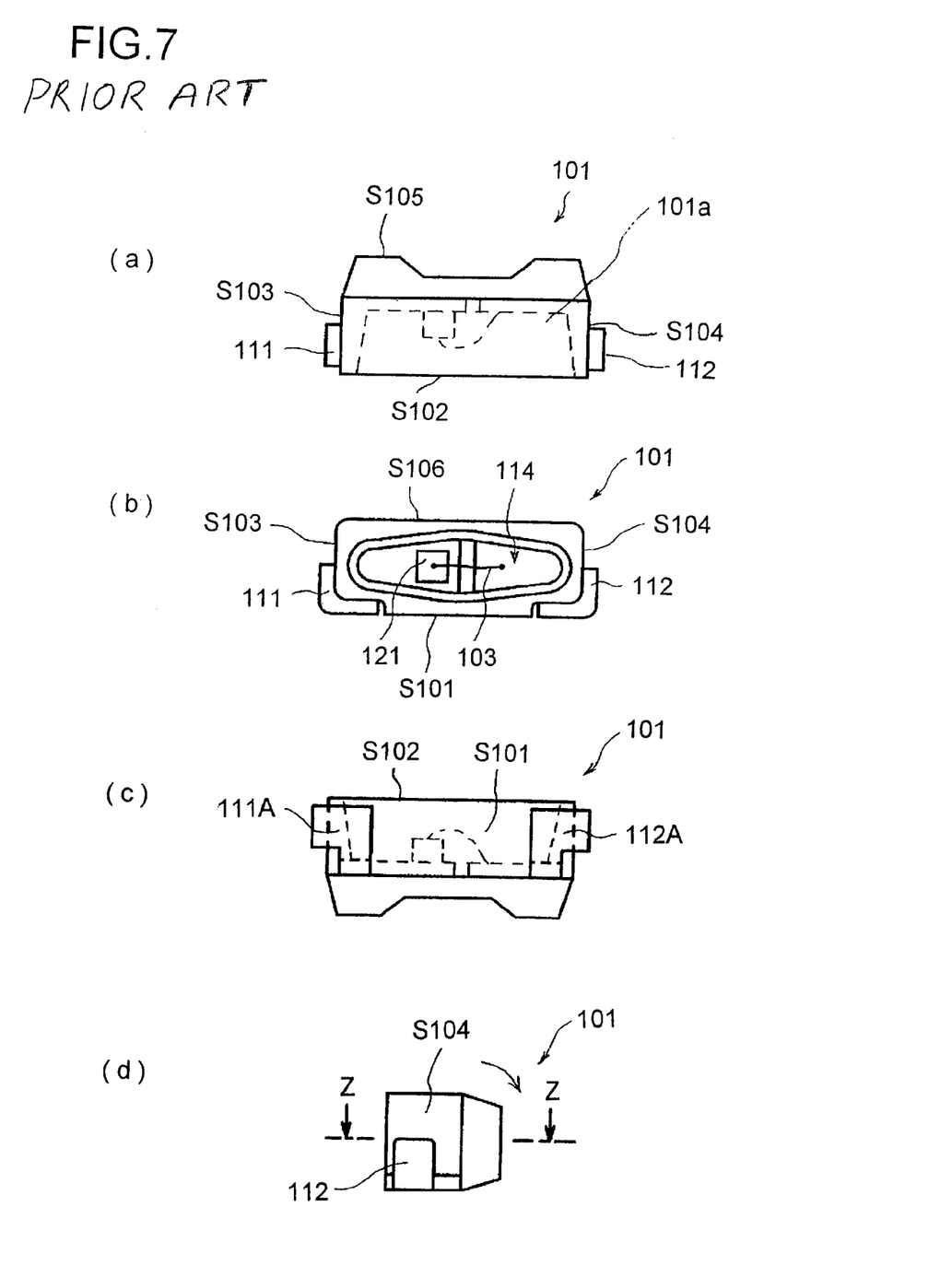
[FIG. 7] Diagrams schematically showing an example of a conventional LED indicator, FIG. 7(a) being a top view schematically showing the exterior appearance of the conventional LED indicator, FIG. 7(b) being a front view schematically showing the conventional LED indicator, FIG. 7(c) being a bottom view schematically showing the conventional LED indicator, and FIG. 7(d) being a side view schematically showing the conventional LED indicator.

FIGS. 7(a) to 7(d) schematically show an example of such a conventional LED indicator (more specifically, a "side emission LED indicator; hereinafter referred to simply as an "LED indicator). FIG. 7(a) is a top view schematically showing the exterior appearance of the conventional LED indicator; FIG. 7(b) is a front view schematically showing the conventional LED indicator; FIG. 7(c) is a bottom view schematically showing the conventional LED indicator; and FIG. 7(d) is a side view schematically showing the conventional LED indicator.

FIG. 8(a) is a schematic cross-sectional view along line Z-Z shown in FIG. 7(d).

FIG. 8(b) is a perspective view of a lead terminal portion extracted from the conventional LED indicator.

Figure 8:
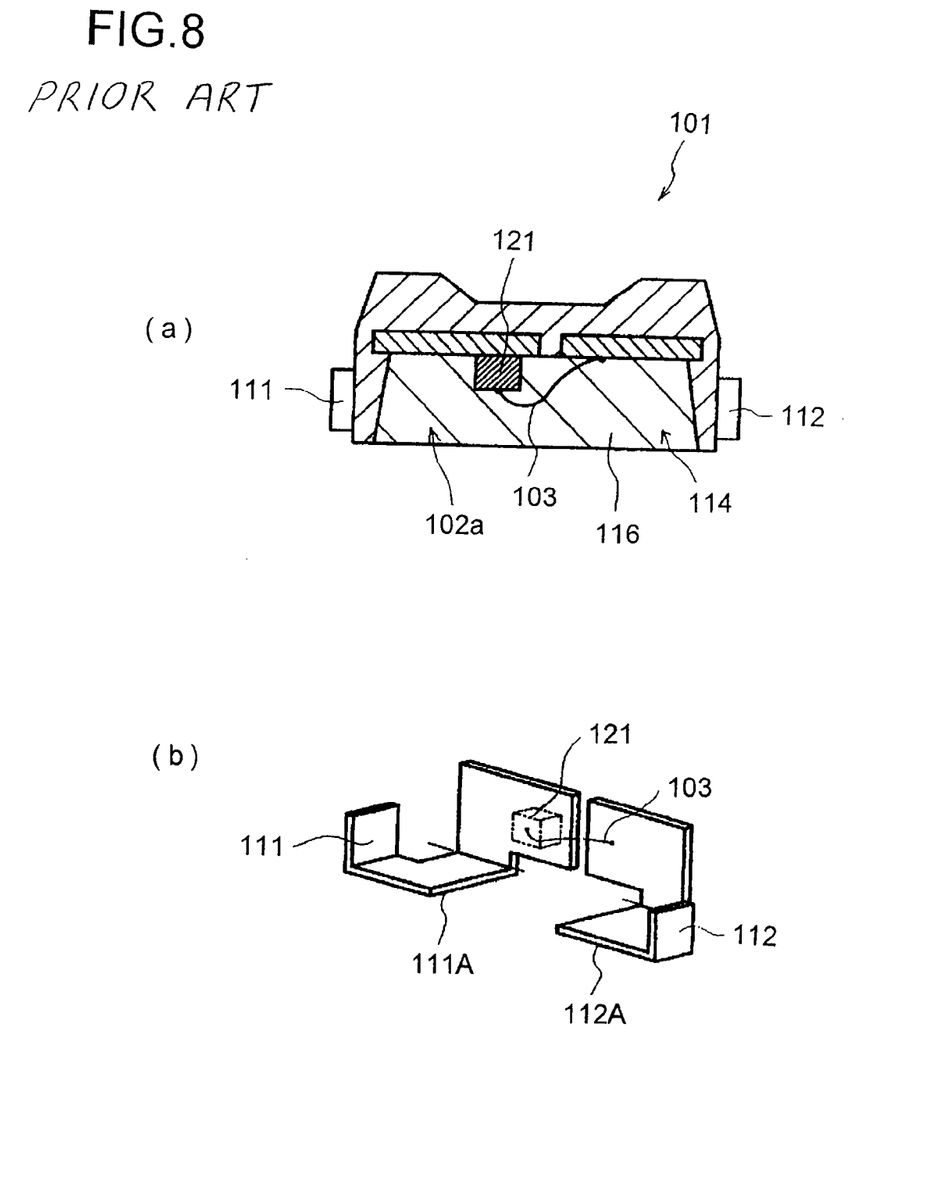

The conventional LED indicator 101 has a casing 101a and lead terminals 111 and 112.

The casing 101a has a bottom face S101, a front face S102 having an aperture 102a formed therein to permit light emission, paired side faces S103 and S104 adjoining the front face S102, a rear face S105, and a top face S106.

The lead terminals 111 and 112 are partly buried in the casing 101a.

As will be clear from FIGS. 7(c) and 8(b), in the conventional LED indicator 101, the lead terminals 111 and 112 are led out to the bottom face S101 of the casing 101a.

In this LED indicator 101, of the lead terminals 111 and 112 led out to the bottom face S101 of the casing 101a, the portions located outside it are each bent, along the bottom face S101, toward the front face S102. These portions are called electrode portions 111A and 112A. The end portions of the lead terminals 111 and 112 thus have a shape bent upward, from the bottom face S101 toward the top face S106, along the side faces S103 and S104 respectively.

Moreover, the lead terminals 111 and 112 are partly exposed inside a recess 114 that forms the aperture 102a.

To the portion of the lead terminal 111 exposed inside the recess 114, one end of a light-emitting element (LED) 121 is fixed and connected. The other end of the light-emitting element (LED) 121 is connected, via a lead wire 103, to the portion of the lead terminal 112 exposed inside the recess 114.

When this LED indicator 101 is connected to a circuit formed on a circuit board (unillustrated), the electrode portions 111A and 112A of the lead terminals 111 and 112 led out to the bottom face S101 are soldered to the circuit board (unillustrated).

The recess 114 is usually filled and sealed with transparent epoxy resin or transparent silicone 116, or with transparent epoxy resin or transparent silicone 116 mixed with a fluorescent material.

Patent Document 1: JP-A-2003-168824
Patent Document 2: JP-A-2003-249689
Patent Document 3: Japanese Registered Design No. 175164
Patent Document 4: Japanese Registered Design No. 175166

DISCLOSURE OF THE INVENTION

Problems to be Solved by the Invention

In the conventional LED indicator 101 described above, paired lead terminals 111 and 112 are led out to the bottom face S101. Thus, when the electrode portions 111A and 112A of the LED indicator 101 are soldered to a circuit board (unillustrated), heat conducts via the portions of the lead terminals 111 and 112 led out of the casing 101a, and heats the portions of the casing 101a at which the lead terminals 111 and 112 are led out, occasionally deforming these portions.

A deformation in these lead-out portions may spoil the air-tightness between the casing 101a and the lead terminal 111 or between the casing 101a and the lead terminal 112, and may thereby allow entry of moisture or flux into the casing 101a, degrading the reliability of the LED indicator 101.

Moreover, to meet the needs for further thinness, LED indicators of recent designs are made increasingly small and thin; accordingly, the distance between the electrode portions 111A and 112A and the casing 101a and the distance between the electrode portions 111A and 112A become increasingly short, and the areas over which the electrode portions 111A and 112A are buried in the casing 101a become increasingly small. These factors all act to degrade the reliability of LED indicators.

Furthermore, on application of a force acting in the direction indicated by arrows in FIG. 7(d), the casing 101a moves, and accordingly the front face S102 having the aperture formed therein to permit light emission changes its angle and hence the range it illuminates. This factor also acts to degrade reliability.

The present invention has been devised in view of the problems mentioned above, and its object is to provide an LED indicator joint member suitable for the formation of the casing of an LED indicator, to provide an LED indicator fabricated by use of such an LED indicator joint member, and to provide a method for fabricating an LED indicator using such an LED indicator joint member.

Means for Solving the Problem

To achieve the above object, according to the present invention, an LED indicator joint member for holding together a plurality of LED indicators each having a light-emitting element arranged in a casing provided with paired lead terminals, the LED indicator joint member being formed as an electrically conductive member, is characterized in that the LED indicator joint member has paired first hanger members for supporting the bottom face of the casing and paired second hanger members for supporting the top face of the casing, and that the interval between the first hanger members is different from the interval between the second hanger members so that either the first hanger members are located inward of the second hanger members or the second hanger members are located inward of the first hanger members.

With this structure, the gap between the tip ends of the first hanger members and the tip ends of the second hanger members can be kept small, and thus the height (thickness) of the LED indicator can be made small.

Moreover, according to the present invention, the LED indicator joint member structured as described above is further characterized in that there are provided terminal formation portions that form the paired lead terminals, and that the terminal formation portions are so shaped as to run around the tip ends of the hanger members.

With this structure, the height (thickness) of the LED indicator can be made smaller.

Moreover, forming dents in the terminal formation portions so that they run around the tip ends of the hanger members gives the terminal formation portions a shape approximately like the letter S, and thereby helps secure long heat dissipation paths.

Moreover, according to the present invention, the LED indicator joint member structured as described above is further characterized in that the casing is, in the bottom face thereof, provided with stepped portions where to locate the electrode portions of the lead terminals, and that the first hanger members are located in the stepped portions.

With this structure, the traces of the removal of the tip end portions of the first hanger members are located in the stepped portions, and thus, even when burrs develop at the traces, the burrs do not hamper the fitting of the LED indicator.

According to the present invention, an LED indicator having a light-emitting element arranged on paired lead terminals inside a casing is characterized in that the casing is formed by use of an LED indicator joint member having paired first hanger members for supporting the bottom face of the casing and paired second hanger members for supporting the top face of the casing, the interval between the first hanger members being different from the interval between the second hanger members so that either the first hanger members are located inward of the second hanger members or the second hanger members are located inward of the first hanger members, with the result that the casing has, on the bottom face thereof, paired first recesses as traces of being supported by the first hanger members and, on the top face thereof, paired second recesses as traces of being supported by the second hanger members so that either the first recesses are located inward of the second recesses or the second recesses are located inward of the first recesses.

With this structure, the gap between the tip ends of the first hanger members and the tip ends of the second hanger members in the LED indicator joint member can be kept small, and thus the height (thickness) of the LED indicator can be made small.

According to the present invention, a method for fabricating an LED indicator having a light-emitting element arranged on paired lead terminals inside a casing is characterized in that the LED indicator is fabricated: by use of an LED indicator joint member provided with paired first hanger members for supporting the bottom face of the casing and paired second hanger members for supporting the top face of the casing, the interval between the first hanger members being different from the interval between the second hanger members so that either the first hanger members are located inward of the second hanger members or the second hanger members are located inward of the first hanger members, the LED indicator joint member being provided with a plurality of combinations of the first and second hanger members; and as a result of the casing being formed for each combination of the first and second hanger members and thereafter the casing being separated from the first and second hanger members.

With this method, a plurality of LED indicator casings or LED indicators are held together by hanger members. This makes it easier to firmly support the LED indicator casings or LED indicators during fabrication and inspection processes than when a plurality of LED indicator casings or LED indicators are fabricated one by one. Moreover, they no longer need to be arranged one by one in a box or otherwise specially attended to for transport, but can be handled in groups of a given number of them. This ensures easy transport. In addition, by use of the LED indicator joint member described above, it is possible to realize an LED indicator with a small height (thickness).

With the LED indicator joint member according to the present invention, the electrically conductive member of which the lead terminals of a plurality of LED indicator casings or LED indicators are formed is used as hanger members to hold together adjacent casings. This eliminates the need to prepare separate hanger members specially. That is, the LED indicator joint member according to the present invention offers the advantage of efficient use of resources.

In an LED indicator fabricated by use of the LED indicator joint member described above, paired lead terminals are led out via the side faces of the casing respectively. This helps make longer the distances between the electrode portions of the lead terminals and the portions thereof led out of the casing than in the structure where paired lead terminals are each led out via the bottom face of the casing. As a result, the heat of the soldering performed when the LED indicator is mounted on a circuit board does not easily conduct to the portions of the lead terminals led out of the casing, and the lead-out portions are less easily heated. This helps prevent deformation in these portions. That is, with this casing, after the LED indicator is mounted on a circuit board, the airtightness between the lead terminals and the casing remains unspoilt. Thus, it is possible to enhance the reliability of the LED indicator after it is mounted on a circuit board. Moreover, when the bent portions of the paired lead terminals on the side faces of the casing are made perpendicular to the mounting target circuit board, the casing is prevented from becoming slanted relative to the surface of the mounting target circuit board even if it receives an external force after mounting on the circuit board. This helps maintain satisfactory mounting accuracy. Furthermore, when the paired lead terminals are bent along the side and bottom faces of the casing so that the electrode portions of the respective lead terminals are located at the bottom, their exterior dimensions can be made approximately as large as those of the casing.

Moreover, providing stepped portions at both ends of the bottom face of the casing and locating the electrode portions of the lead terminals in those stepped portions makes it possible to reduce the height of the casing as much as the height of the electrode portions of the lead terminals while securing the height of the aperture for light emission. Furthermore, making the bottom face of the casing and the bottom faces of the electrode portions flush makes it possible to fix the LED indicator stably and make a variation in height after mounting less likely.

Advantages of the Invention

According to the present invention, an LED indicator joint member for holding together a plurality of LED indicators each having a light-emitting element arranged in a casing provided with paired lead terminals, the LED indicator joint member being formed as an electrically conductive member, is characterized in that the LED indicator joint member has paired first hanger members for supporting the bottom face of the casing and paired second hanger members for supporting the top face of the casing, and that the interval between the first hanger members is different from the interval between the second hanger members so that either the first hanger members are located inward of the second hanger members or the second hanger members are located inward of the first hanger members. This makes it possible to keep small the gap between the tip ends of the first hanger members and the tip ends of the second hanger members, and thereby to make the height (thickness) of the LED indicator small.

BRIEF DESCRIPTION OF DRAWINGS

FIG. 3(b) being a perspective view of a lead terminal portion extracted from the LED indicator casing and the LED indicator shown in FIG. 1.

FIG. 5(c) being a cross-sectional view along line V-V shown in FIG. 5(b).

[FIG. 8] Diagrams schematically showing an example of a conventional LED indicator, FIG. 8(a) being a schematic cross-sectional view along line Z-Z shown in FIG. 7(d), and FIG. 8(b) being a perspective view of a lead terminal portion extracted from the conventional LED indicator shown in FIG. 7.

LIST OF REFERENCE SYMBOLS

1 LED indicator
1R LED indicator casing
1a casing
2a aperture
3 lead wire
11, 12 lead terminals
11A, 12A electrode portions of the lead terminals
14 recess
51 LED indicator joint member
S1 bottom face of the casing
S2 front face of the casing
S3, S4 side faces of the casing
S6 top face of the casing
P1, P2 stepped portions of the casing
C1A, C2A, C1B, C2B recesses
21 light-emitting element (LED)
30 electrically conductive member
31A, 32A, 31B, 32B hanger portions Best Mode for Carrying Out the Invention Hereinafter, with reference to the drawings, more detailed descriptions will be given of an example of an LED indicator casing according to the present invention, an example of an LED indicator having a light-emitting element (LED) mounted on such an LED indicator casing, and an example of an LED indicator joint member having a plurality of such LED indicator casings or LED indicators held together.

Figure 1:
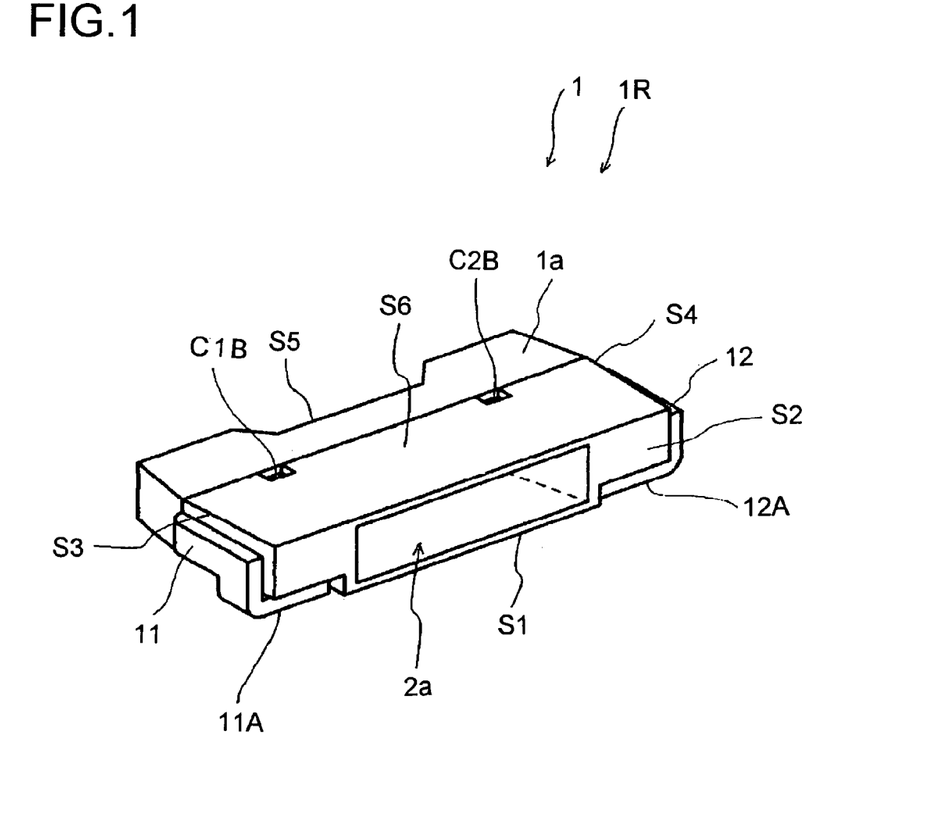
[FIG. 1] A perspective view schematically showing an example of an LED indicator casing and an LED indicator according to the present invention.

FIG. 1 is a perspective view schematically showing an example of an LED indicator casing and an LED indicator according to the present invention. FIG. 2(a) is a top view schematically showing the LED indicator casing and the LED indicator according to the present invention shown in FIG. 1 (a plan view schematically showing them as seen from up down); FIG. 2(b) is a front view schematically showing the LED indicator casing and the LED indicator shown in FIG. 1;

FIG. 2(c) is a bottom view schematically showing the LED indicator casing and the LED indicator shown in FIG. 1; and FIG. 2(d) is a side view schematically showing the LED indicator casing and the LED indicator shown in FIG. 1.

Figure 2:
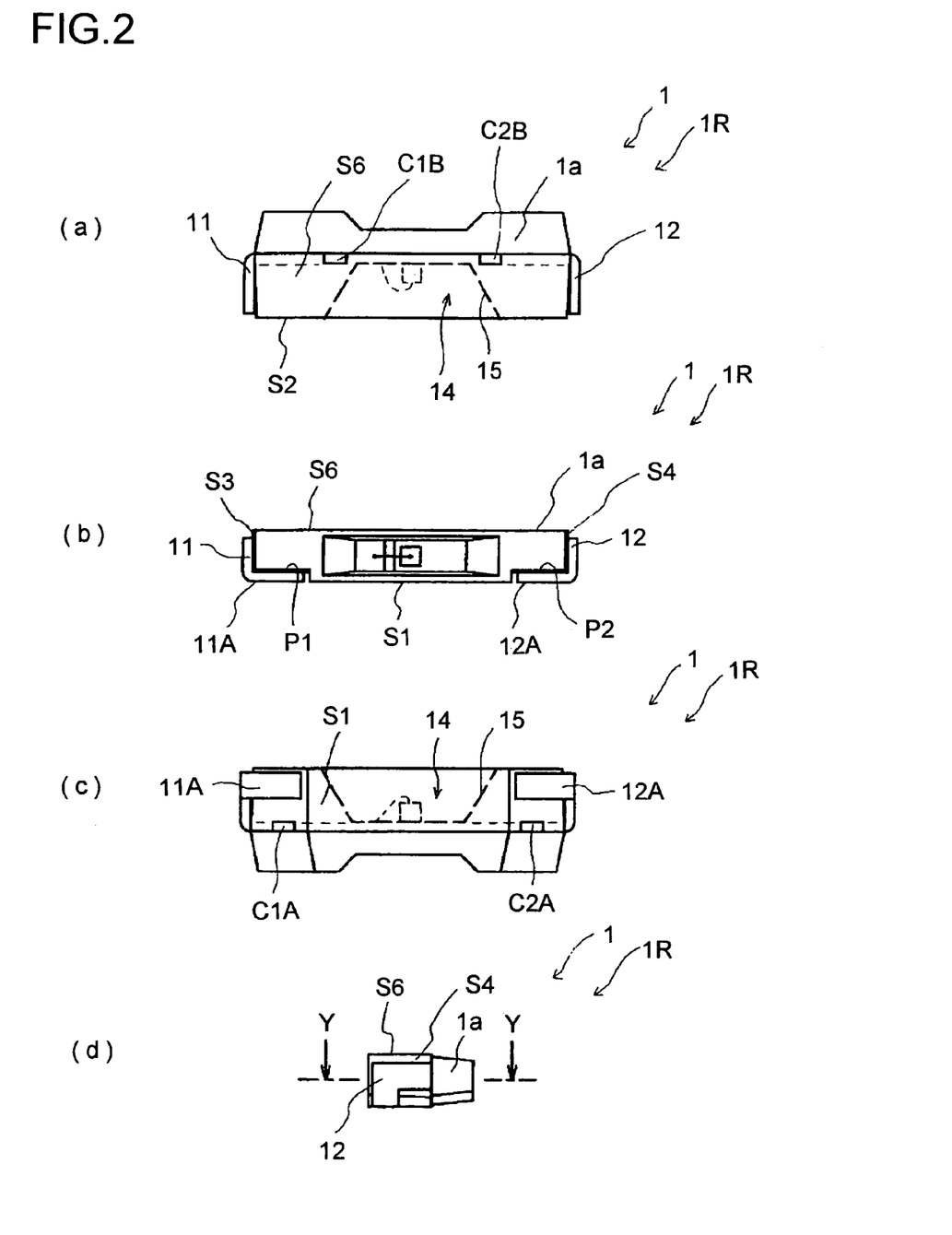
[FIG. 2] Diagrams schematically showing an example of an LED indicator casing and an LED indicator according to the present invention, FIG. 2(a) being a top view schematically showing the LED indicator casing and the LED indicator shown in FIG. 1 as seen from above, FIG. 2(b) being a front view schematically showing the LED indicator casing and the LED indicator shown in FIG. 1, FIG. 2(c) being a bottom view schematically showing the LED indicator casing and the LED indicator shown in FIG. 1, and FIG. 2(d) being a side view schematically showing the LED indicator casing and the LED indicator shown in FIG. 1.
Figure 3:
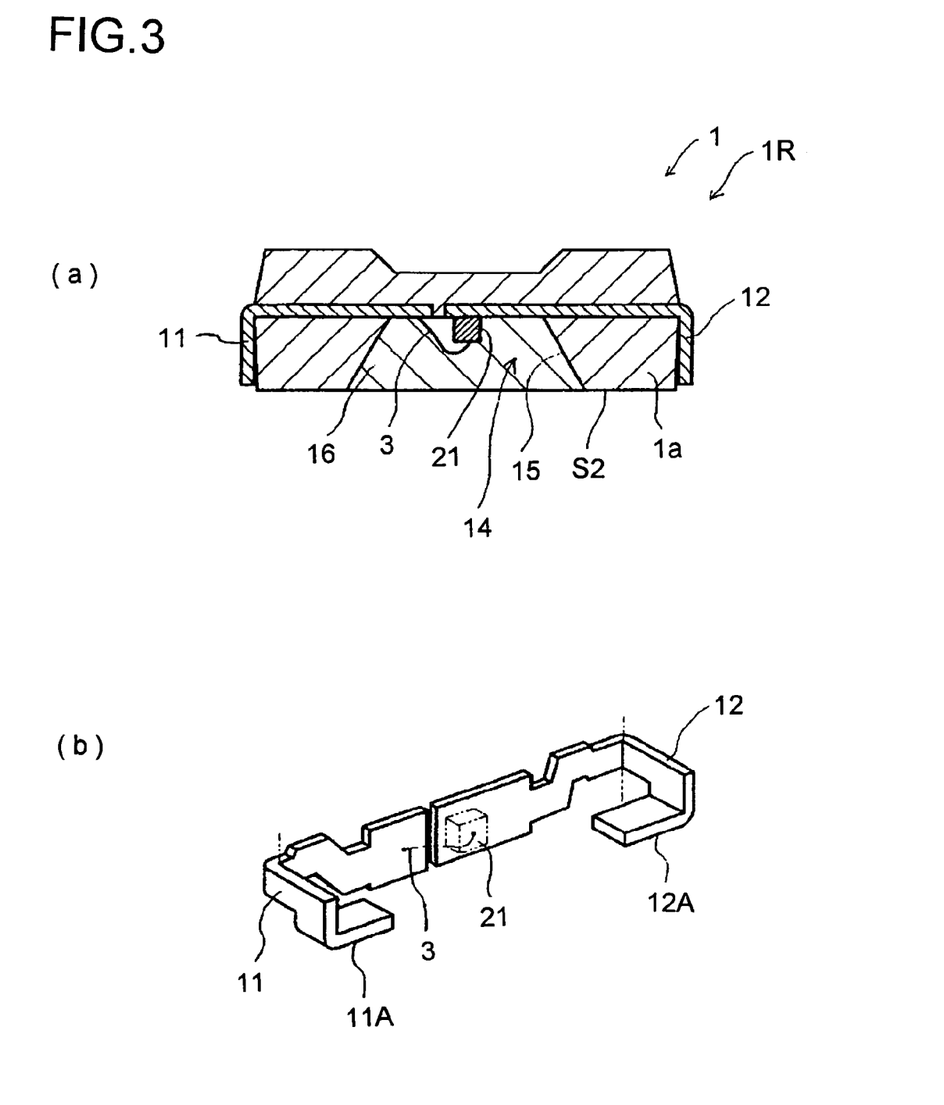
[FIG. 3] Diagrams schematically showing an example of an LED indicator casing and an LED indicator according to the present invention, FIG. 3(a) being a cross-sectional view along line Y-Y shown in FIG. 2(d)

FIG. 3(a) is a cross-sectional view along line Y-Y shown in FIG. 2(d); and FIG. 3(b) is a perspective view of a lead terminal portion extracted from the LED indicator casing and the LED indicator shown in FIG. 1.

Here, whereas what is referred to as the "LED indicator 1" has a light-emitting element (LED) 21 mounted thereon, what is referred to as the "LED indicator casing 1R" has no light-emitting element (LED) 21 mounted thereon yet.

A casing 1a has a bottom face S1, a front face S2 having an aperture 2a formed therein to permit light emission, paired side faces S3 and S4 adjoining the front face S2, a rear face S5, and a top face S6.

In the bottom face S1, there are paired recesses C1A and C2A; in the top face S6, there are paired recesses C1B and C2B. These four recesses are traces that indicate that the later-described hanger members were buried in the casing 1a.

Lead terminals 11 and 12 are partly buried in the casing 1a.

What characterizes this LED indicator 1 is that the paired lead terminals 11 and 12 are led out via the paired side faces S3 and S4 respectively.

Furthermore, in the LED indicator 1, the paired lead terminals 11 and 12 led out via the paired side faces S3 and S4 respectively are bent along the corresponding paired side faces S3 and S4 respectively toward the front face S2. Then, end portions of the lead terminals 11 and 12 are each bent inward along the bottom face S1, so that electrode portions 11A and 12A of the lead terminals 11 and 12 are located in both end portions of the bottom face S1 respectively.

Moreover, in the LED indicator 1, in both end portions of the bottom face S1, stepped portions P1 and P2 are provided, and the electrode portions 11A and 12A of the lead terminals 11 and 12 are located in both end portions of the bottom face S1 respectively.

In the LED indicator 1, in the LED indicator casing 1R, a light-emitting element (LED) 21 is mounted on one of the paired lead terminals 11 and 12.

In this example, one end of the light-emitting element (LED) 21 is firmly connected to the part of the lead terminal 12 exposed inside a recess 14 forming the aperture 2a of the casing 1a, and the other end of the light-emitting element 21 is connected, via a lead wire 3, to the portion of the lead terminal 11 inside the recess 14 forming the aperture 2a of the casing 1a.

In this example, used as the light-emitting element 21 is a semiconductor light-emitting element (LED) that has a P layer and an N layer of semiconductors formed on each other so as to emit light from the junction surface between the P and N layers when a direct current is passed.

The lead wire 3 is a fine wire of gold or the like, and is bonded to the light-emitting element 21 and to the lead terminal 11.

The lead terminals 11 and 12 are formed of a sheet material of iron, copper, or an alloy of copper, with a thickness of about 0.10 mm to 0.15 mm, and are silver-plated on the surface.

Selected and used as the material of the casing 1a is a material that is high in heat resistance, low in thermal expansion coefficient, low in hygroscopicity, and easy to mold and process, examples of such materials including polyphthalamide resin, liquid crystal polymer, and nylon-based resin.

The aperture 2a of the recess 14 of the casing 1a is so shaped as to be increasingly large toward the front face S2.

The light radiated from the light-emitting element (LED) 21 is reflected on a wall surface 15 thereof so as to be emitted toward the front face S2.

The recess 14 of the aperture 2a of the casing 1a is filled and sealed with sealing resin at the end of the fabrication procedure.

The sealing resin 16 is transparent epoxy resin or transparent silicone, or transparent epoxy resin or transparent silicone mixed with a fluorescent material or the like.

Next, an example of how the LED indicator 1 is mounted on a circuit board will be explained.

First, the bottom face S1 of the LED indicator 1 is placed opposite a circuit board (unillustrated).

Next, the electrode portions 11A and 12A of the lead terminals 11 and 12 are soldered to the circuit board (unillustrated), so that the LED indicator 1 is mounted on the circuit board.

In this LED indicator 1, the paired lead terminals 11 and 12 are led out via both side faces S3 and S4 of the casing 1a respectively. This helps make longer the distances between the electrode portions 11A and 12A and the portions of the paired lead terminals 11 and 12 led out of the casing 1a than in the structure shown in FIG. 7 where the paired lead terminals 111 and 112 are each led out via the bottom face S101 of the casing 101a.

Thus, in the LED indicator 1, when it is mounted on a circuit board (unillustrated), the heat of soldering does not easily conduct to the portions of the paired lead terminals 11 and 12 led out of the casing 1a, and hence the lead terminals 11 and 12 do not easily heat the portions of the casing 1a where the lead terminals 11 and 12 are led out. This helps prevent deformation of the portions of the casing 1a where the lead terminals 11 and 12 are led out. That is, with this LED indicator 1, after it is mounted on a circuit board (unillustrated), the air-tightness between the lead terminals 11 and 12 and the casing 1a remains unspoilt. As a result, the LED indicator 1 remains highly reliable after it is mounted on a circuit board (unillustrated).

Furthermore, the portions of the lead terminals 11 and 12 bent along the casing 1a are located not on the rear face as shown in FIG. 8 but on the paired side faces S3 and S4, and are therefore perpendicular to the surface of the circuit board (unillustrated). Thus, even when an external force as shown in FIG. 7(d) is applied after mounting on a circuit board (unillustrated), the aperture 2a is prevented from becoming slanted relative to the surface of the mounting target circuit board. This helps maintain satisfactory mounting accuracy.

Moreover, in the LED indicator 1, the paired lead terminals 11 and 12 are bent along the side faces S3 and S4 and along the bottom face S1, so that the electrode portions 11A and 12A of the lead terminals 11 and 12 are located at the bottom. This helps make their exterior dimensions approximately as large as those of the casing 1a, contributing to compactness.

Moreover, in the LED indicator 1, stepped portions P1 and P2 are provided in both end portions of the bottom face S1 of the casing 1a, and the electrode portions 11A and 12A of the lead terminals 11 and 12 are located in the paired stepped portions P1 and P2 respectively. This makes it possible to reduce the height of the casing 1a as much as the height of the electrode portions 11A and 12A of the lead terminals 11 and 12 while securing the height of the aperture 2a. Moreover, since the bottom face S1 of the casing 1a and the bottom faces of the electrode portions 11A and 12A are flush, when the LED indicator 1 is mounted on a circuit board (unillustrated), the LED indicator 1 can be fixed stably, making a variation in height after mounting less likely.

Next, an example of the fabrication procedure of an LED indicator joint member 51 will be explained.

Figure 4:
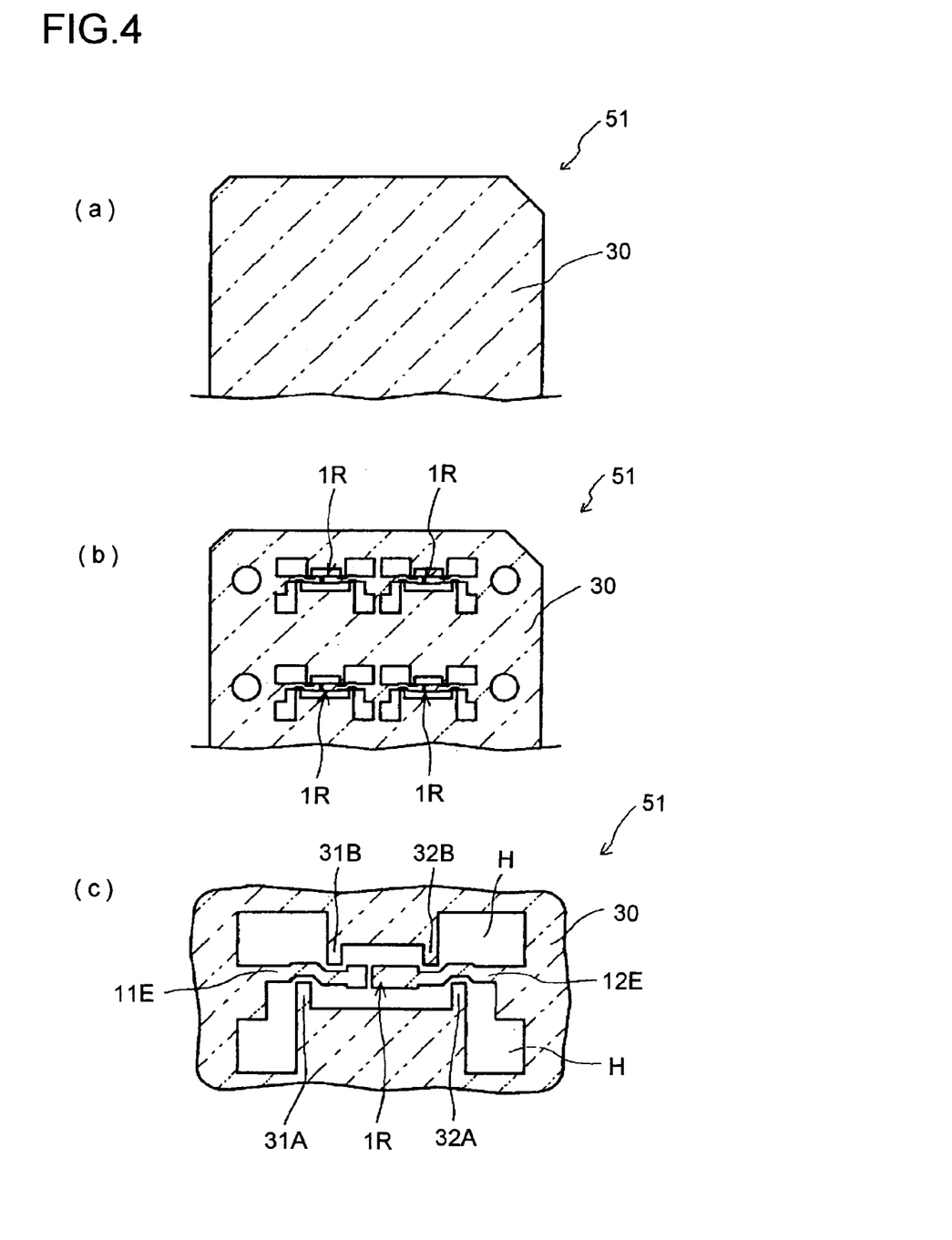
[FIG. 4] Procedure diagrams illustrating an example of the fabrication procedure of an LED indicator joint member according to the present invention, FIG. 4(a) being a front view of an electrically conductive member, FIG. 4(b) being a front view of the electrically conductive member punched into a shape forming constituent members of a plurality of LED indicator casings, and FIG. 4(c) being an enlarged front view of the shape of one of the plurality of LED indicator casings into the shape of which the electrically conductive member is punched as shown in FIG. 4(b).
Figure 5:
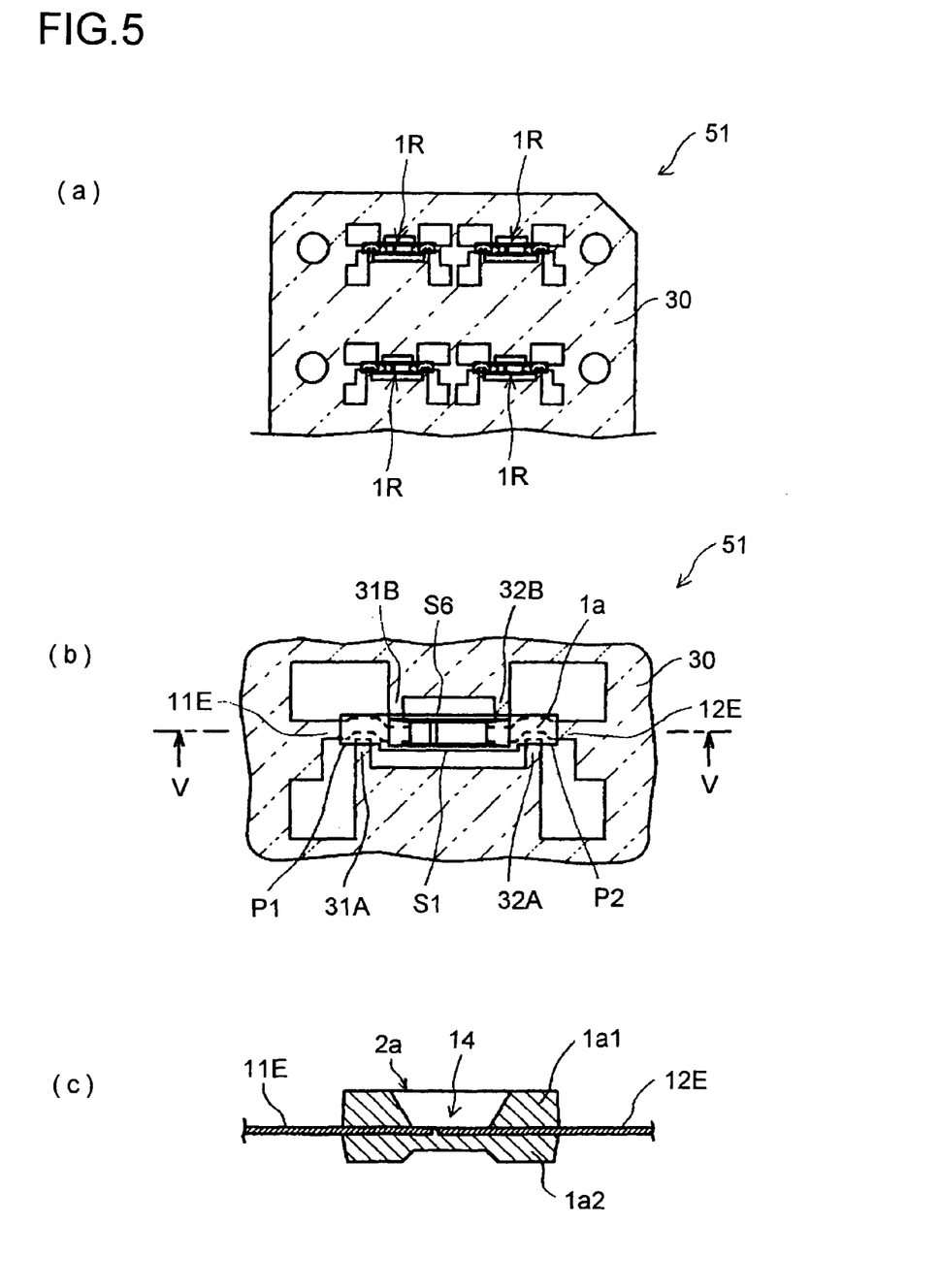
[FIG. 5] Procedure diagrams illustrating an example of the fabrication procedure of an LED indicator casing using an LED indicator joint member according to the present invention, FIG. 5(a) being a front view of an LED indicator joint member having a plurality of LED indicator casings formed thereon by resin molding, FIG. 5(b) being an enlarged front view of one of the locations where the LED indicator casings are formed as shown in FIG. 5(a)
Figure 6:
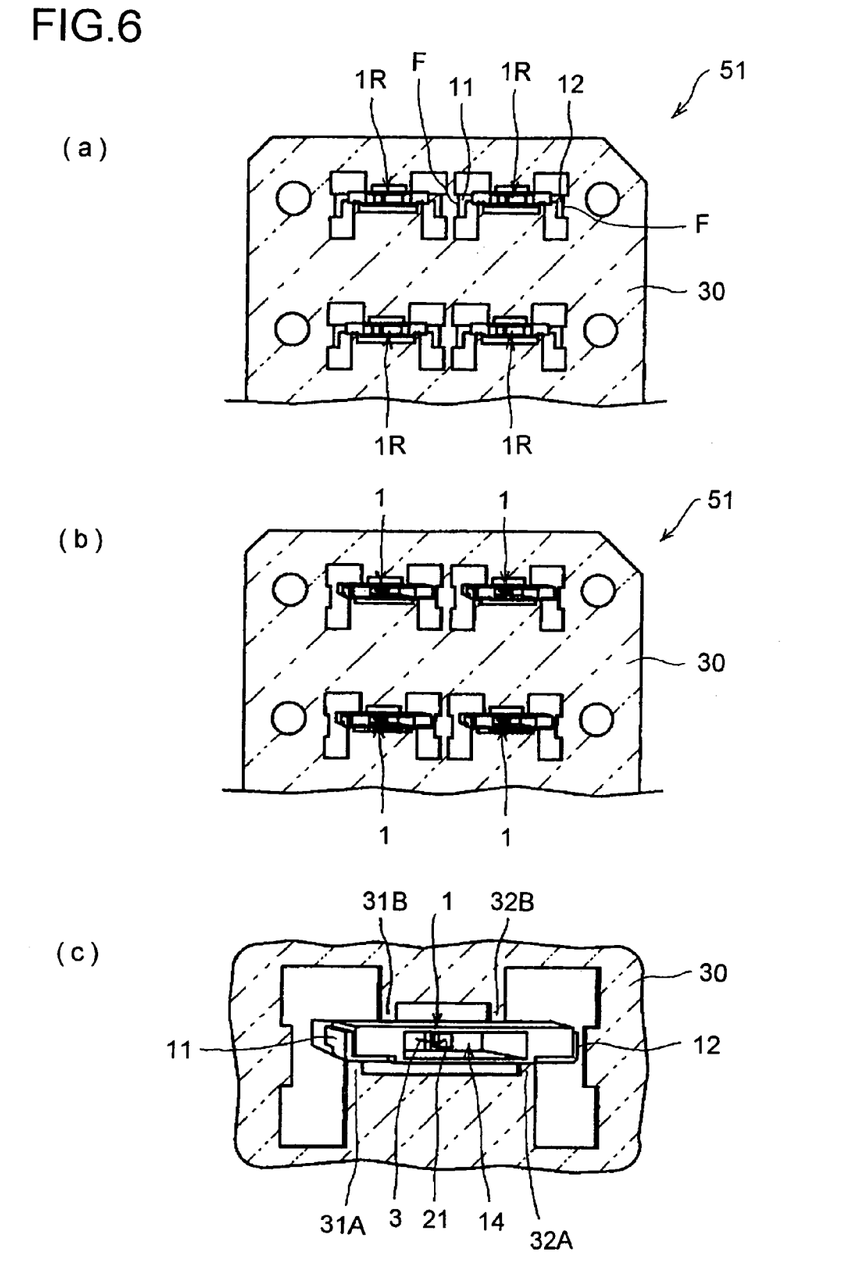
[FIG. 6] Procedure diagrams illustrating an example of the fabrication procedure of an LED indicator using an LED indicator joint member according to the present invention, FIG. 6(a) being a front view of the LED indicator joint member, with the lead terminal formation portions of a plurality of LED indicator casings cut at a predetermined position, FIG. 6(b) being a front view of the LED indicator joint member showing, in a perspective view, the LED indicators after the bending of the lead terminals and the mounting of light-emitting elements (LED), and FIG. 6(c) being an enlarged view of one of the LED indicators shown in FIG. 6(b).

FIGS. 4, 5, and 6 are procedure diagrams illustrating an example of the fabrication procedure of an LED indicator joint member 51 according to the present invention. In FIGS. 4, 5, and 6, for easy understanding, the part where a sheet material exists is indicated by hatching with dash-dot-dot lines at 45 degrees.

FIG. 4(a) is a front view showing an electrically conductive member 30 in the form of a sheet cut into a predetermined size. In the fabrication procedure, first, a electrically conductive member 30 like this is prepared. The electrically conductive member 30 is formed of a sheet material of iron, copper, or an alloy of copper, with a thickness of about 0.10 mm to 0.15 mm, and is silver-plated on the surface.

Next, as shown in FIG. 4(b), the electrically conductive member 30 is sequentially punched into a shape forming constituent members of a plurality of LED indicator casings 1R. FIG. 4(c) is an enlarged front view of one of the LED indicator casings 1R punched as shown in FIG. 4(b).

There are formed lead terminal formation portions 11E and 12E as constituent members of each LED indicator casing 1R, and hanger members 31A, 32A, 31B, and 32B.

In FIG. 4(c), the part indicated by "H" is an opening formed when the electrically conductive member 30 is punched.

The part of the electrically conductive member 30 left around the opening holds together the plurality of LED indicator casings 1R or LED indicators 1.

In this example, the electrically conductive member 30 has the hanger members 31A and 32A formed outside the lower side face of the paired terminal formation portions 11E and 12E, at a predetermined distance therefrom, and has the hanger members 31B and 32B formed outside the upper side face of the paired terminal formation portions 11E and 12E, at a predetermined distance therefrom. The hanger members 31A and 32A and the hanger members 31B and 32B are arranged at asymmetric positions with respect to the paired terminal formation portions 11E and 12E so that the gaps between the tip ends of the hanger members are as small as possible across the paired terminal formation portions 11E and 12E (so as to make the height (thickness) of the LED indicator 1 as small as possible). In this example, the interval between the hanger members 31A and 32A located on one side is made longer than the interval between the hanger members 31B and 32B located on the other side, so that the hanger members 31B and 32B are arranged inward of the hanger members 31A and 32A. Since the hanger members 31A and 32A are located in the stepped portions P1 and P2 located in both end portions of the bottom face S1 of the LED indicator 1, the interval between the hanger members 31A and 32A is longer than the interval between the hanger members 31B and 32B.

To make the height (thickness) of the LED indicator 1 still smaller, the shape of the terminal formation portions 11E and 12E is ingeniously designed. Specifically, as shown in FIG. 4(c), dents are formed in the parts of the terminal formation portions 11E and 12E facing the tip ends of the hanger members 31A and 32A and the hanger members 31B and 32B. These dents help secure the regions for accommodating the tip ends of the hanger members 31A and 32A and the hanger members 31B and 32B without increasing the height (thickness) of the LED indicator 1. Moreover, forming the dents in the paired terminal formation portions 11E and 12E gives them a shape approximately like the letter S with a predetermined width, which shape permits them to run around the tip ends of the hanger members 31A and 32A and the hanger members 31B and 32B. Giving the terminal formation portions 11E and 12E a shape approximately like the letter S also helps secure longer heat dissipation paths.

Next, as shown in FIG. 5(a), in a plurality of LED indicator casings 1R, casings are formed from in front and behind by resin molding. FIG. 5(b) is an enlarged front view of one of the LED indicator casings 1R shown in FIG. 5(a), and FIG. 5(c) is a schematic cross-sectional view along line V-V shown in FIG. 5(b).

So as to correspond to the paired terminal formation portions 11E and 12E of the LED indicator casing 1R, there is formed a casing front-side member 1a1 that has a front face having an aperture 2a formed therein for light emission and that has a recess 14. Moreover, on the other side of the paired terminal formation portions 11E and 12E, there is formed a casing rear-side member 1a2 that has a rear face. The casing front-side member 1a1 and the casing rear-side member 1a2 together form the casing 1a.

Furthermore, between each casing 1a composed of the casing front-side member 1a1 and the casing rear-side member 1a2 and a casing 1a adjacent thereto, the top face S6 of one of those adjacent casings 1a and the bottom face S1 of the other are held together by the hanger members 31A, 32A, 31B, and 32B formed by the electrically conductive member 30 that also forms the lead terminals 11 and 12 of each of the plurality of the LED indicators.

Here, the casing 1a and the casing 1a adjacent thereto are held together by the hanger members 31A, 32A, 31B, and 32B.

The hanger members are formed at the following positions. As shown in FIG. 5(b), the lower-pair hanger members 31A and 32A are located in the stepped portions P1 and P2 in both end portions of the bottom face S1 of the casing 1a respectively. The upper-pair hanger members 31B and 32B are located closer to the center than the lower-pair ones are, and outside the recess 14 of the aperture 2a of the casing 1a.

The hanger members 31A, 32A, 31B, and 32B are, in tip end portions thereof with predetermined dimensions, buried in the casing 1a and resin molded so as to hold the LED indicator casing 1R or the LED indicator 1. The traces left after the buried portions of the hanger members 31A, 32A, 31B, and 32B are removed are the paired recesses C1A and C2A in the bottom face S1 and the paired recesses C1B and C2B in the top face S6 shown in FIGS. 1 and 2. Since the recesses C1A and C2A, where burrs tend to develop, are located in the stepped portions P1 and P2 in both end portions of the bottom face S1 of the LED indicator 1, even when burrs develop at the traces of the removal of the tip end portions of the hanger members 31A and 32A, the burrs do not hamper the fitting of the LED indicator 1.

Next, as shown in FIG. 6(a), the terminal formation portions 11E and 12E of each of the plurality of LED indicator casings 1R are sequentially cut at predetermined positions F, so that the paired lead terminals 11 and 12 are formed.

Next, the paired lead terminals 11 and 12 led out via the side faces of the casing 1a of each of the plurality of LED indicator casings 1A are bent toward the front face S2 along the paired side faces S3 and S4 respectively as shown in FIGS. 1 and 2. Next, end portions of the lead terminals 11 and 12 are bent inward along the bottom face S1, so that the electrode portions 11A and 12A of the lead terminals 11 and 12 are located in both end portions of the bottom face S1 respectively.

Next, in this example, on one of the paired lead terminals 11 and 12 of each of the plurality of LED indicators, to the portion thereof exposed inside the recess 14 of the casing 1a, a light-emitting element (LED) 21 is connected and fixed. The other end of the light-emitting element 21 is connected, via a lead wire 3, to the portion of the lead terminal 11 inside the recess 14 of the casing 1a.

FIG. 6(b) is a perspective view of the plurality of LED indicators 1 after the bending of the lead terminals and the mounting of the light-emitting elements (LED), and FIG. 6(c) being an enlarged perspective view of one of the plurality of LED indicators 1.

As will be clear from FIG. 6(b), in this LED indicator joint member 51, a plurality of LED indicators 1 are held together by their respective hanger members 31A, 32A, 31B, and 32B. Moreover, as a result of each of the plurality of LED indicators 1 being held by its hanger members 31A, 32A, 31B, and 32B, even after the terminal formation portions 11E and 12E of each LED indicator are cut off from the electrically conductive member 30, the plurality of LED indicators 1 do not come apart.

Thus, it is easier to firmly support the LED indicators during fabrication and inspection processes then when a plurality of LED indicator casings 1R or LED indicators 1 are fabricated one by one. Moreover, they no longer need to be arranged one by one in a box or otherwise specially attended to for transport, but can be handled in groups of a given number of them. This ensures easy transport.

In addition, in the LED indicator joint member 51, the electrically conductive member 30 of which the lead terminals 11 and 12 of each of the plurality of LED indicator casings 1R or LED indicators 1 are formed is used as the hanger members 31A, 32A, 31B, and 32B so that adjacent casings 1a are kept adjacent. This eliminates the need to prepare separate hanger members specially. That is, the LED indicator joint member 51 offers the advantage of efficient use of resources.

On completion of inspection processes, the LED indicator joint member 51 is transported as it is to a site where it is subjected as it is to quality control.

Then, on completion of the quality control inspection, the individual LED indicators 1 are separated from the LED indicator joint member 51.

When the plurality of LED indicators 1 are separated from the LED indicator joint member 51, the hanger members 31A, 32A, 31B, and 32B holding together the individual LED indicators 1 are extracted from their respective casings 1a.

Industrial Applicability

LED indicator joint members according to the present invention can be used widely in the fabrication of LED indicators with small heights.

LED indicators fabricated by the use of LED indicator joint members according to the present invention can be used suitably and widely as thin and reliable LED indicators and hence as backlight sources for liquid crystal displays in compact appliances such as portable telephones.

The invention claimed is:

1. An LED indicator joint member for holding together a plurality of LED indicators each having a light-emitting element arranged in a casing provided with paired lead terminals, the LED indicator joint member comprising:
a substantially planar electrically conductive sheet, wherein the electrically conductive sheet comprises:
paired lead terminal formation portions, that form the paired lead terminals;
paired first hanger members for supporting a bottom face of the casing;
paired second hanger members for supporting a top face of the casing, wherein an interval between the paired first hanger members is different from an interval between the paired second hanger members so that either the paired first hanger members are located inward of the paired second hanger members or the paired second hanger members are located inward of the paired first hanger members, and
the electrically conductive sheet is punched such that the paired lead terminals and the hanger members are formed along longitudinal and lateral lines.

2. The LED indicator joint member of claim 1, wherein the paired lead terminal formation portions are shaped so as to extend around tip ends of said paired first and second hanger members.

3. The LED indicator joint member of claim 1, wherein the paired lead terminal portions comprise stepped portions and the first hanger members are located at the stepped portions.

4. An LED indicator having a light-emitting element arranged on paired lead terminals inside a casing, comprising:
the casing formed from an LED indicator joint member, the LED indicator joint member comprising:
an electrically conductive member, comprising:
opposing end portions that are folded to form the paired lead terminals underlying a bottom face of the casing,
paired first hanger members for supporting the bottom face of the casing, and
paired second hanger members for supporting a top face of the casing, wherein an interval between the paired first hanger members is different from an interval between the paired second hanger members so that either the paired first hanger members are located inward of the paired second hanger members or the paired second hanger members are located inward of the paired first hanger members;
paired first recesses formed in the bottom face of the casing through which the casing is supported by the paired first hanger members;
paired second recesses formed in the top face of the casing through which the casing is supported by the paired second hanger members so that either the paired first recesses are located inward of the paired second recesses or the paired second recesses are located inward of the paired first recesses.

5. A method for fabricating an LED indicator having a light-emitting element arranged on paired lead terminals inside a casing, comprising:
providing an LED indicator joint member, the LED indicator joint member comprising:
an electrically conductive member, comprising:
opposing end portions that are folded to form the paired lead terminals underlying a bottom face of the casing,
paired first hanger members for supporting the bottom face of the casing, and
paired second hanger members for supporting a top face of the casing, wherein an interval between the paired first hanger members is different from an interval between the paired second hanger members so that either the paired first hanger members are located inward of the paired second hanger members or the paired second hanger members are located inward of the paired first hanger members, and the LED indicator joint member is provided with a plurality of combinations of the paired first and paired second hanger members;
forming the casing for each combination of the paired first and paired second hanger members; and separating the casing from the paired first and paired second hanger members.

* * * * *